(12) United States Patent
Kato

(10) Patent No.: US 12,293,949 B2
(45) Date of Patent: May 6, 2025

(54) SEMICONDUCTOR MODULE AND METHOD FOR MANUFACTURING SEMICONDUCTOR MODULE

(71) Applicant: FUJI ELECTRIC CO., LTD., Kawasaki (JP)

(72) Inventor: Ryoichi Kato, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 379 days.

(21) Appl. No.: 17/824,365

(22) Filed: May 25, 2022

(65) Prior Publication Data
US 2023/0005801 A1 Jan. 5, 2023

(30) Foreign Application Priority Data

Jun. 25, 2021 (JP) ................. 2021-106024

(51) Int. Cl.
| | | |
|---|---|---|
| H01L 23/10 | (2006.01) | |
| H01L 21/56 | (2006.01) | |
| H01L 23/00 | (2006.01) | |
| H01L 23/053 | (2006.01) | |
| H01L 23/31 | (2006.01) | |
| H01L 25/065 | (2023.01) | |
| H01L 25/07 | (2006.01) | |

(52) U.S. Cl.
CPC ............ *H01L 23/10* (2013.01); *H01L 21/565* (2013.01); *H01L 23/053* (2013.01); *H01L 23/3121* (2013.01); *H01L 23/3142* (2013.01); *H01L 24/48* (2013.01); *H01L 25/0655* (2013.01); *H01L 25/072* (2013.01); *H01L 2224/48155* (2013.01); *H01L 2224/48225* (2013.01); *H01L 2924/1203* (2013.01); *H01L 2924/13055* (2013.01); *H01L 2924/1711* (2013.01); *H01L 2924/17151* (2013.01); *H01L 2924/172* (2013.01); *H01L 2924/173* (2013.01); *H01L 2924/182* (2013.01); *H01L 2924/183* (2013.01); *H01L 2924/35121* (2013.01)

(58) Field of Classification Search
CPC .................. H01L 23/02–10; H01L 25/072
See application file for complete search history.

(56) References Cited

FOREIGN PATENT DOCUMENTS

| | | |
|---|---|---|
| JP | 2003-124406 A | 4/2003 |
| JP | 2012-64880 A | 3/2012 |
| JP | 2012-204366 A | 10/2012 |
| JP | 2014-229848 A | 12/2014 |

*Primary Examiner* — David A Zarneke

(57) ABSTRACT

There are provided a semiconductor module capable of preventing the peeling of a sealing resin on the side where a connection section used for the connection to a semiconductor element is arranged and a manufacturing method for a semiconductor module. A semiconductor module includes: an outer frame; sealing resins; gate signal output terminals, and partition sections laid across the outer flame to partition a space into a plurality of housing sections, in the partition sections which the gate signal output terminals with connection sections exposed are arranged. The partition sections have through holes where sealing resins are formed, the sealing resins connecting adjacent housing sections and the sealing resin formed in the through hole being continuous with the sealing resins formed in the housing sections.

20 Claims, 7 Drawing Sheets

SEMICONDUCTOR MODULE AND METHOD FOR MANUFACTURING SEMICONDUCTOR MODULE

CROSS REFERENCE TO RELATED APPLICATIONS

This application is claims the priority benefit of Japanese Application No. 2021-106024 filed on Jun. 25, 2021, the contents of which are incorporated herein by reference.

TECHNICAL FIELD

The present invention relates to a semiconductor module applied to a power converter and the like and a method for manufacturing a semiconductor module.

BACKGROUND ART

In recent years, power semiconductor modules, mainly an insulated gate bipolar transistor (IGBT), have been widely used for power converters. The power semiconductor module is a power semiconductor device containing one or two or more power semiconductor chips and forming part or all of conversion connections, and having a structure in which the one or two or more power semiconductor chips are electrically insulated from a base plate or a cooling surface. PTL 1 discloses a semiconductor device capable of reducing the occurrence of the peeling of bonding wires. PTL 2 discloses a semiconductor device capable of suppressing the peeling of a sealing resin even when operated at a high temperature. PTL 3 discloses a metal press working method enabling partial roughening treatment in a short time and a resin-sealed metal component having excellent sealing properties and peeling strength by ensuring bonding properties and adhesiveness to a resin of a metal component for resin sealing obtained by the metal press working method. PTL 4 discloses a semiconductor device preventing the peeling of a resin when a thermal stress is applied to improve the reliability.

CITATION LIST

Patent Literature

PTL 1: JP 2014-229848 A
PTL 2: JP 2012-204366 A
PTL 3: JP 2012-64880 A
PTL 4: JP 2003-124406 A

SUMMARY OF INVENTION

Technical Problem

The power semiconductor modules have been required to have various sizes from a small size to a large size with an increase in current and withstand voltage. Under such circumstances, there is a risk that a stress generated on the surface of a structure adhering to a sealing resin provided in the power semiconductor module increases, so that the sealing resin is peeled from the structure. The peeling of the sealing resin from the structure has posed a problem of the occurrence of a break in a wire provided in the sealing resin and used for wire bonding.

It is an object of the present invention to provide a semiconductor module capable of preventing the peeling of a sealing resin on the side where a connection section used for the connection to a semiconductor element is arranged and a manufacturing method for the semiconductor module.

Solution to Problem

To achieve the above-described object, a semiconductor module according to one aspect of the present invention has: an outer frame defining a space where a plurality of semiconductor elements is arranged; sealing resins formed in the space to cover the plurality of semiconductor elements; control terminals connected to the semiconductor elements and configured to output control signals to the semiconductor elements, the control signals controlling the semiconductor elements; and a partition section laid across the outer frame to partition the space into a plurality of regions, in the partition section which the control terminals with connection sections to the semiconductor elements exposed are arranged, in which the partition section has a through hole where a sealing resin is formed, the through hole connecting the adjacent regions and the sealing resin formed in the through hole being continuous with the sealing resins formed in the adjacent regions.

To achieve the above-described object, a method for manufacturing a semiconductor module according to one aspect of the present invention includes: forming a first member where control terminals connected to semiconductor elements and configured to output control signals to the semiconductor elements, the control signals controlling the semiconductor elements, are arranged; forming a through hole penetrating the first member; setting the first member in a predetermined mold; and pouring a resin into the mold to form an outer frame defining a space where the semiconductor elements are arranged and a partition section formed integrally with the outer frame and partitioning the space into a plurality of regions together with the first member.

Advantageous Effects of Invention

One aspect of the present invention can prevent the peeling of the sealing resin on the side where the connection sections used for the connection to the semiconductor elements are arranged.

DESCRIPTION OF EMBODIMENTS

Each embodiment of the present invention exemplifies a device and a method for embodying the technical idea of the present invention, and the technical idea of the present invention does not specify the materials, shapes, structures, arrangement, and the like of constituent components to the materials, shapes, structures, arrangement, and the like described below. The technical idea of the present invention can be variously altered within the technical scope defined by claims.

Figure 1:
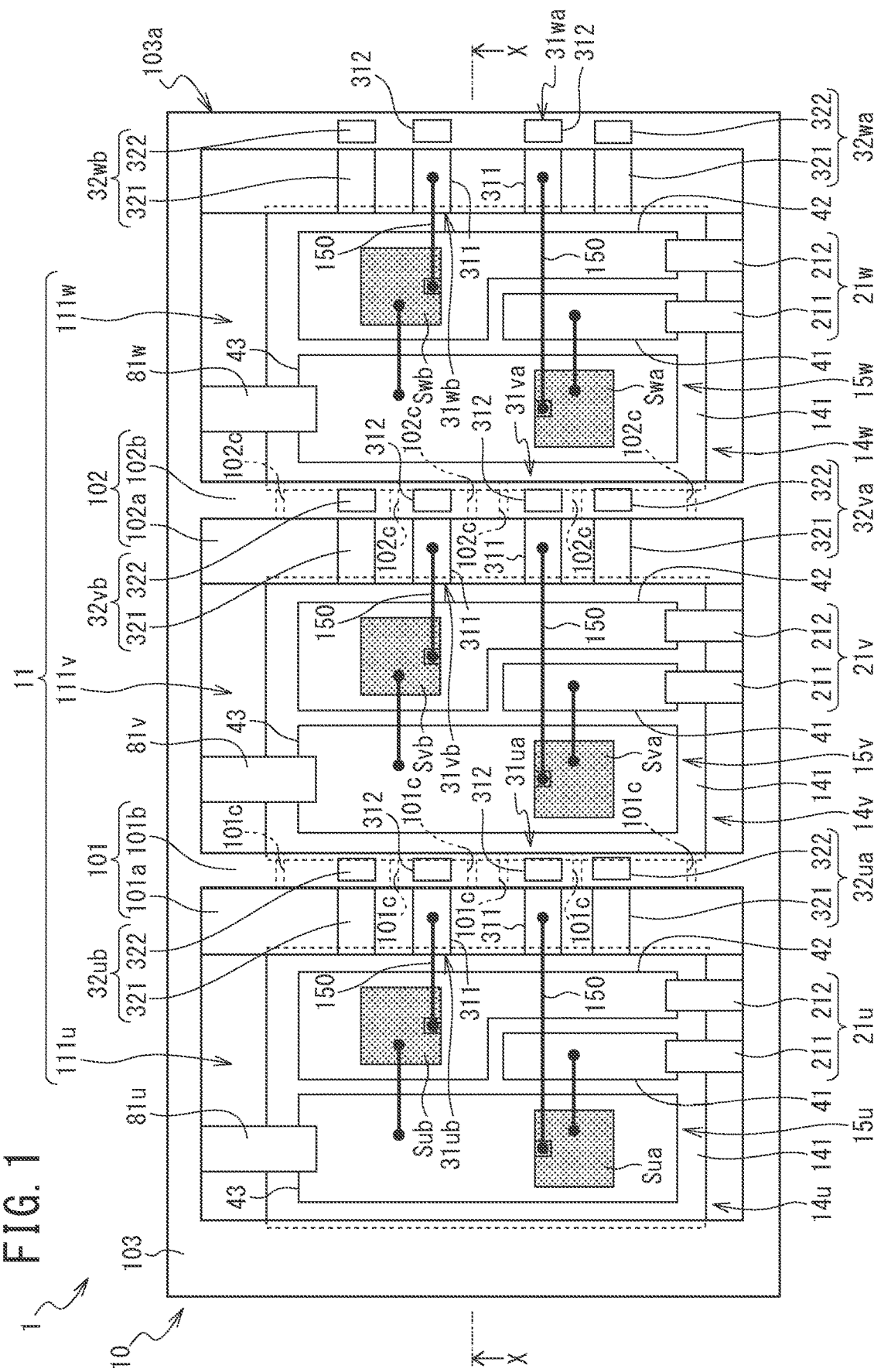
FIG. 1 is a plan view illustrating an example of the schematic configuration of a semiconductor module according to one embodiment of the present invention.
Figure 2:
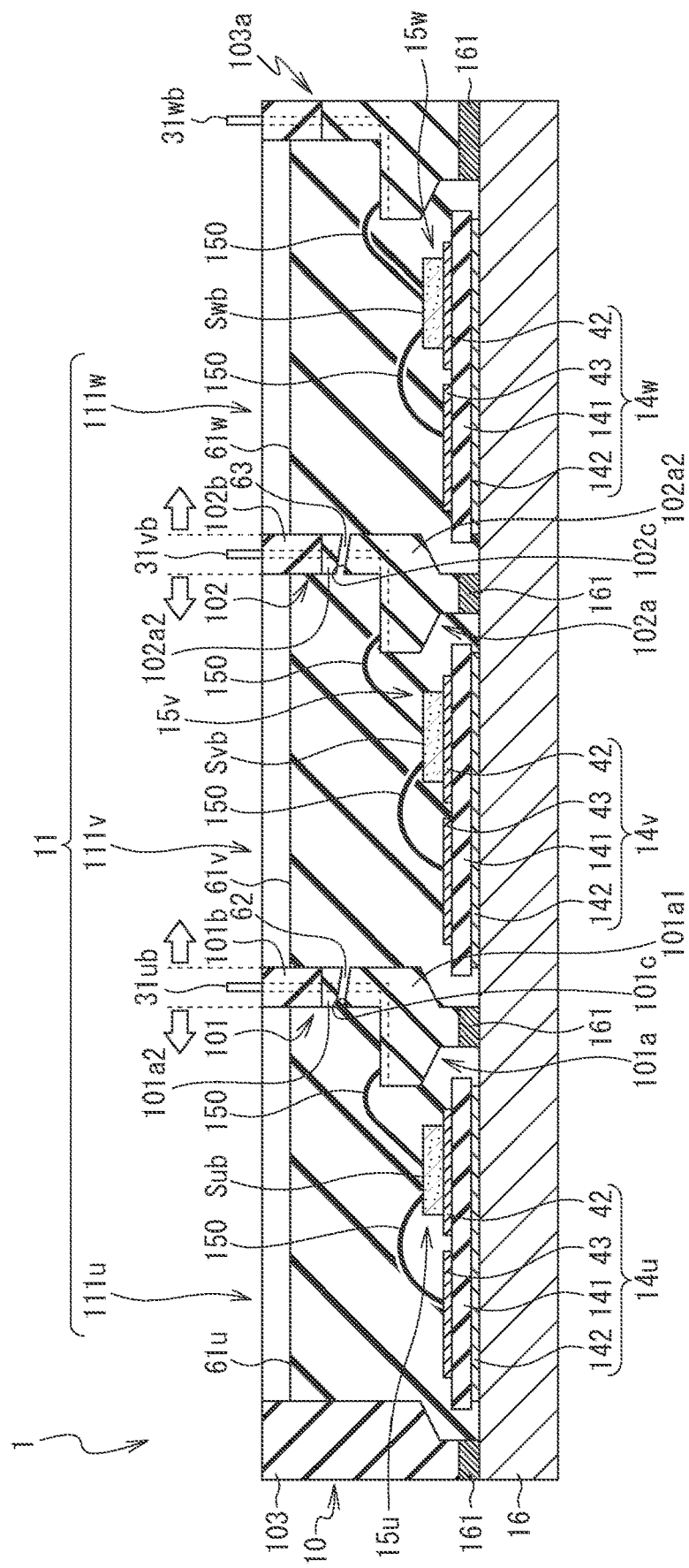
FIG. 2 is a diagram for explaining an example of the schematic configuration of the semiconductor module according to one embodiment of the present invention and is a cross-sectional view cut along the X-X line illustrated in FIG. 1.

A semiconductor module according to one embodiment of the present invention is described using FIG. 1 to FIG. 7. First, the schematic configuration of the semiconductor module according to this embodiment is described using FIG. 1 to FIG. 4. In this embodiment, a description is given taking a power conversion module enabling DC/AC conversion as an example of the semiconductor module. In FIG. 1, the illustration of sealing resins provided in the semiconductor module is omitted. In FIG. 1, hidden lines of through holes and the like are illustrated by the broken lines. In FIG. 2, hidden lines of gate signal output terminals and the like are illustrated by the broken lines.

As illustrated in FIG. 1, a semiconductor module 1 according to this embodiment includes an outer frame 103 defining a space 11 where a plurality (six semiconductor elements in this embodiment) of semiconductor elements Sua, Sub, Sva, Svb, Swa, Swb is arranged. The outer frame 103 defines the space 11 in a rectangular shape in plan view. The outer frame 103 is made of a thermoplastic resin having insulation properties, for example. Examples of the thermoplastic resin include a polyphenylene sulfide (PPS) resin, a polybutylene terephthalate (PBT) resin, a polybutylene succinate (PBS) resin, a polyamide (PA) resin, an acrylonitrile butadiene styrene (ABS) resin, and the like, for example.

As illustrated in FIG. 2, the semiconductor module 1 includes sealing resins 61$u$, 61$v$, 61$w$ formed in the space 11 to cover the plurality of semiconductor elements Sua to Swb. The sealing resins 61$u$, 61$v$, 61$w$ are made of a material different from the material of the outer frame 103, for example. The sealing resins 61$u$, 61$v$, 61$w$ are made of an epoxy resin, for example. The sealing resins 61$u$, 61$v$, 61$w$ are sealing members sealing constituent elements, such as the plurality of semiconductor elements Sua to Swb provided in the space 11 and laminated substrates 14$u$, 14$v$, 14$w$ mounted with the plurality of semiconductor elements Sua to Swb. The sealing resins 61$u$, 61$v$, 61$w$ can improve the insulation properties between a predetermined conductive pattern (details of which are described later) formed on each of the laminated substrates 14$u$, 14$v$, 14$w$ by sealing the laminated substrates 14$u$, 14$v$, 14$w$, respectively. Further, the sealing resins 61$u$, 61$v$, 61$w$ seal various control terminals (details of which are described later) connected to the laminated substrates 14$u$, 14$v$, 14$w$ by wire bonding and wires, for example, used for the wire bonding, and thus can suppress stresses and strains generated in the various control terminals and bonded sections of the wires. Thus, the sealing resins 61$u$, 61$v$, 61$w$ can improve the reliability of the semiconductor module 1.

Returning to FIG. 1, the semiconductor module 1 includes gate signal output terminals 31$ua$, 31$ub$, 31$va$, 31$vb$, 31$wa$, 31$wb$ (an example of the control terminal) which are connected to the semiconductor elements Sua to Swb and from which gate pulse signals (an example of the control signal) controlling the semiconductor elements Sua to Swb are output and reference signal output terminals 32$ua$, 32$ub$, 32$va$, 32$vb$, 32$wa$, 32$wb$ (an example of the control terminal) which are connected to the semiconductor elements Sua to Swb and from which reference signals are output. Details of the terminals, such as the gate signal output terminal 31$ua$, are described later.

The semiconductor module 1 includes partition sections 101, 102 laid across the outer frame 103 to partition the space 11 into a plurality of housing sections 111$u$, 111$v$, 111$w$ (an example of the plurality of regions), in the partition sections 101, 102 which the gate signal output terminals 31$ua$ to 31$wb$ with connection sections 311 to the semiconductor elements Sua to Swb exposed and the reference signal output terminals 32$ua$ to 32$wb$ with connection sections 312 to the semiconductor elements Sua to Swb exposed are arranged. The partitions 101, 102 are formed of the same material as the material of the outer frame 103 integrally with the outer frame 103. A case 10 is constituted by the partition sections 101, 102 and the outer frame 103. Details of the partition sections 101, 102 are described later.

As illustrated in FIG. 1, in the case 10, the space 11 is divided by the partition sections 101, 102 into the three regions of the housing section 111$u$ housing a U-phase inverter section, the housing section 111$v$ housing a V-phase inverter section, and the housing section 111$w$ housing a W-phase inverter section. The partition section 101 partitions a part of the space 11 into the housing section 111$u$ and the housing section 111$v$. The partition section 102 partitions the other part of the space 11 into the housing section 111$v$ and the housing section 111$w$.

The housing section 111$u$ has a rectangular shape in plan view. The housing section 111$u$ is defined by parts of the outer frame 103 arranged on the three consecutive sides (two short sides and one long side) of the four outer peripheral sides and the partition section 101 arranged on the remaining one side (the remaining long side). The housing section 111$v$ has a rectangular shape in plan view. The housing section 111$v$ is defined by the other parts of the outer frame 103 arranged on the facing short sides of the four outer peripheral sides and the partition section 101 and the partition section 102 arranged on the facing long sides. The housing section 111$w$ has a rectangular shape in plan view. The housing section 111$w$ is defined by the remaining parts of the outer frame 103 arranged on the three consecutive sides (two short sides and one long side) of the four outer peripheral sides and the partition section 102 arranged on the remaining one side (the remaining long side).

As illustrated in FIG. 1, the semiconductor module 1 has the laminated substrate 14$u$ for the U-phase housed in the housing section 111$u$ and an inverter circuit 15$u$ for the U-phase mounted on the laminated substrate 14$u$. The semiconductor module 1 has the laminated substrate 14$v$ for the V-phase housed in the housing section 111$v$ and an inverter circuit 15$v$ for the V-phase mounted on the laminated substrate 14$v$. The semiconductor module 1 has the laminated substrate 14$w$ for the W-phase housed in the housing section 111$w$ and an inverter circuit 15$w$ for the W-phase mounted on the laminated substrate 14$w$.

As illustrated in FIG. 1, the semiconductor module 1 has a U-phase power input terminal 21$u$ into which DC power is input from the outside, a V-phase power input terminal 21$v$ into which the DC power is input, and a W-phase power input terminal 21$w$ into which the DC power is input. Each of the power input terminals 21$u$, 21$v$, 21$w$ has a positive electrode terminal 211 connected to the positive electrode side of the DC power and a negative electrode terminal 212 connected to the negative electrode side of the DC power.

The semiconductor module 1 has a power output terminal 81u arranged in a part of the outer frame 103 to face the power input terminal 21u across the housing section 111u. The semiconductor module 1 has a power output terminal 81v arranged in a part of the outer frame 103 to face the power input terminal 21v across the housing section 111v. The semiconductor module 1 has a power output terminal 81w arranged in a part of the outer frame 103 to face the power input terminal 21w across the housing section 111w.

The positive electrode terminal 211 of the power input terminal 21u is connected to a positive electrode section pattern 41 which is formed on the laminated substrate 14u and to which the semiconductor element Sua is connected. The negative electrode terminal 212 of the power input terminal 21u is connected to a negative electrode section pattern 42 which is formed on the laminated substrate 14u and to which the semiconductor element Sub is connected. The power output terminal 81u is connected to an output section pattern 43 formed on the laminated substrate 14u. Thus, the semiconductor module 1 can generate U-phase AC power by the inverter circuit 15u using the DC power supplied from the outside via the power input terminal 21u, and supply the generated U-phase AC power from the power output terminal 81u to a motor M (not illustrated in FIG. 1, see FIG. 3), for example, to be driven.

The positive electrode terminal 211 of the power input terminal 21v is connected to the positive electrode section pattern 41 which is formed on the laminated substrate 14v and to which the semiconductor element Sva is connected. The negative electrode terminal 212 of the power input terminal 21v is connected to the negative electrode section pattern 42 which is formed on the laminated substrate 14v and to which the semiconductor element Svb is connected. The power output terminal 81v is connected to the output section pattern 43 formed on the laminated substrate 14v. Thus, the semiconductor module 1 can generate V-phase AC power by the inverter circuit 15v using the DC power supplied from the outside via the power input terminal 21v, and supply the generated V-phase AC power from the power output terminal 81v to the motor M, for example, to be driven.

The positive electrode terminal 211 of the power input terminal 21w is connected to the positive electrode section pattern 41 which is formed on the laminated substrate 14w and to which the semiconductor element Swa is connected. The negative electrode terminal 212 of the power input terminal 21w is connected to the negative electrode section pattern 42 which is formed on the laminated substrate 14w and to which the semiconductor element Swb is connected. The power output terminal 81w is connected to the output section pattern 43 formed on the laminated substrate 14w. Thus, the semiconductor module 1 can generate W-phase AC power by the inverter circuit 15w using the DC power supplied from the outside via the power input terminal 21w, and supply the generated W-phase AC power from the power output terminal 81w to the motor M, for example, to be driven.

As illustrated in FIG. 1, in the partition section 101, the reference signal output terminal 32ua, the gate signal output terminal 31ua, the gate signal output terminal 31ub, and the reference signal output terminal 32ub connected to the inverter circuit 15u are arranged side by side in this order from the power input terminal 21u side toward the power output terminal 81u side. The order and the number of the gate signal output terminals 31ua, 31ub and the reference signal output terminal 32ua, 32ub arranged side by side in the extension direction of the partition section 101 are not limited to the order and the number illustrated in FIG. 1 and may vary depending on the configuration and the arrangement pattern of the inverter circuit 15u to be provided on the laminated substrate 14u.

In the partition section 102, the reference signal output terminal 32va, the gate signal output terminal 31va, the gate signal output terminal 31vb, and the reference signal output terminal 32vb connected to the inverter circuit 15v are arranged side by side in this order from the power input terminal 21v side to the power output terminal 81v side. The order and the number of the gate signal output terminals 31va, 31vb and the reference signal output terminals 32va, 32vb arranged side by side in the extension direction of the partition section 102 are not limited to the order and the number illustrated in FIG. 1 and may vary depending on the configuration and the arrangement pattern of the inverter circuit 15v to be provided on the laminated substrate 14v.

In a terminal arrangement region 103a parallel to the partition sections 101, 102 and forming a part of the outer frame 103 defining the housing section 111w, the reference signal output terminal 32wa, the gate signal output terminal 31wa, the gate signal output terminal 31wb, and the reference signal output terminal 32wb connected to the inverter circuit 15w are arranged side by side in this order from the power input terminal 21w side toward the power output terminal 81w side. The order and the number of the gate signal output terminals 31wa, 31wb and the reference signal output terminals 32wa, 32wb arranged side by side in the extension direction of the terminal arrangement region 103a are not limited to the order and the number illustrated in FIG. 1 and may vary depending on the configuration and the arrangement pattern of the inverter circuit 15w to be provided on the laminated substrate 14w.

The gate signal output terminal 31ua and the reference signal output terminal 32ua arranged in the partition section 101 each are electrically connected to the semiconductor element Sua constituting the inverter circuit 15u by wire bonding. Specifically, the connection section 311 of the gate signal output terminal 31ua and the connection section 321 of the reference signal output terminal 32ua are connected to the semiconductor element Sua by separate wires 150. An input section 312 of the gate signal output terminal 31ua and an input section 322 of the reference signal output terminal 32ua each are connected to a control circuit (not illustrated) controlling the inverter circuits 15u, 15v, 15w.

The gate signal output terminal 31ub and the reference signal output terminal 32ub arranged in the partition section 101 each are electrically connected to the semiconductor element Sub constituting the inverter circuit 15u by wire bonding. Specifically, the connection section 311 of the gate signal output terminal 31ub and the connection section 321 of the reference signal output terminal 32ub are connected to the semiconductor element Sub by different wires 150. The input section 312 of the gate signal output terminal 31ub and the input section 322 of the reference signal output terminal 32ub each are connected to a control circuit (not illustrated) controlling the inverter circuits 15u, 15v, 15w.

The gate signal output terminal 31va and the reference signal output terminal 32va arranged in the partition section 102 each are electrically connected to the semiconductor element Sva constituting the inverter circuit 15v by wire bonding. Specifically, the connection section 311 of the gate signal output terminal 31va and the connection section 321 of the reference signal output terminal 32va are connected to the semiconductor element Sva by separate wires 150. The input section 312 of the gate signal output terminal 31va and the input section 322 of the reference signal output terminal 32wa each are connected to the control circuit (not illustrated) controlling the inverter circuits 15u, 15v, 15w.

The gate signal output terminal 31vb and the reference signal output terminal 32vb arranged in the partition section 102 each are electrically connected to the semiconductor element Svb constituting the inverter circuit 15v by wire bonding. Specifically, the connection section 311 of the gate signal output terminal 31vb and the connection section 321 of the reference signal output terminal 32vb are connected to the semiconductor element Svb by different wires 150. The input section 312 of the gate signal output terminal 31vb and the input section 322 of the reference signal output terminal 32vb each are connected to the control circuit (not illustrated) controlling the inverter circuits 15u, 15v, 15w.

The gate signal output terminal 31wa and the reference signal output terminal 32wa arranged in the terminal arrangement region 103a of the outer frame 103 each are electrically connected to the semiconductor element Swa constituting the inverter circuit 15w by wire bonding. Specifically, the connection section 311 of the gate signal output terminal 31wa and the connection section 321 of the reference signal output terminal 32wa are connected to the semiconductor element Swa by separate wires 150. The input section 312 of the gate signal output terminal 31wa and the input section 322 of the reference signal output terminal 32wa each are connected to the control circuit (not illustrated) controlling the inverter circuits 15u, 15v, 15w.

The gate signal output terminal 31wb and the reference signal output terminal 32wb arranged in the terminal arrangement region 103a of the outer frame 103 each are electrically connected to the semiconductor element Swb constituting the inverter circuit 15w by wire bonding. Specifically, the connection section 311 of the gate signal output terminal 31wb and the connection section 321 of the reference signal output terminal 32wb are connected to the semiconductor element Swb by different wires 150. The input section 312 of the gate signal output terminal 31wb and the input section 322 of the reference signal output terminal 32wb each are connected to the control circuit (not illustrated) controlling the inverter circuits 15u, 15v, 15w.

Although details are described later, the partition section 101 has a through hole 101c (see FIG. 1 and FIG. 2) where a sealing resin 62 (see FIG. 2) is formed, the partition section 101 connecting the housing section 111u and the housing section 111v adjacent to each other and the sealing resin 62 formed in the partition section 101 being continuous with the sealing resin 61u (see FIG. 2) formed in the housing section 111u and the sealing resin 61v (see FIG. 2) formed in the housing section 111v. The partition section 101 has two or more of the through holes 101c (six through holes in this embodiment). Similarly, the partition section 102 has a through hole 102c (see FIG. 1 and FIG. 2) where a sealing resin 63 (see FIG. 2) is formed, the through hole 102c connecting the housing section 111v and the housing section 111w adjacent to each other and the sealing resin 63 formed in the through hole 102c being continuous with the sealing resin 61v formed in the housing section 111v and the sealing resin 61w (see FIG. 2) formed in the housing section 111w. The partition section 102 has two or more of the through holes 102c (six through holes in this embodiment).

As illustrated in FIG. 2, the semiconductor module 1 has a cooler 16 attached to the case 10. The cooler 16 is mechanically fixed to the case 10 with an adhesive 161, for example. The laminated substrates 14u, 14v, 14w are soldered, for example, to the cooler 16. Thus, the semiconductor module 1 can release heat generated from the semiconductor elements Sua to Swb provided on each of the laminated substrates 14u, 14v, 14w to the outside via the cooler 16.

The laminated substrate 14u arranged in the housing section 111u has a rectangular flat plate-shaped insulating substrate 141 and a rectangular flat plate-shaped heat transfer member 142 formed on the lower surface (cooler 16 side) of the insulating substrate 141. The insulating substrate 141 is made of ceramic, for example. The heat transfer member 142 is made of copper, for example. The heat transfer member 142 is connected to the cooler 16 by soldering, for example. On the upper surface of the insulating substrate 141 (the surface opposite to the surface on which the heat transfer member 142 is provided), the inverter circuit 15u is provided.

The laminated substrate 14u arranged in the housing section 111u and the inverter circuit 15u provided on the upper surface of the insulating substrate 141 of the laminated substrate 14u are covered with the sealing resin 61u formed in the housing section 111u. Further, the wire 150 connecting the gate signal output terminal 31ub and the semiconductor element Sub, the wire 150 connecting the semiconductor element Sub and the output section pattern 43, and the other wires 150 used for the wire bonding in the inverter circuit 15u (not illustrated in FIG. 2) are also covered with the sealing resin 61u. The sealing resin 61u seals the inverter circuit 15u and the like in a state of being filled in the space constituting the housing section 111u. Thus, the sealing resin 61u is also formed in gaps among the positive electrode section pattern 41, the negative electrode section pattern 42, and the output section pattern 43 formed on the insulating substrate 141. As a result, the sealing resin 61u can improve the insulation properties of the laminated substrate 14u. The sealing resin 61u is formed in the housing section 111u in a state of covering metal parts, such as the connection section 311 of each of the gate signal output terminals 31ua, 31ub, the connection section 321 of each of the reference signal output terminals 32ua, 32ub, the connection sections used for the electrical connection in the inverter circuit 15u, and the wires 150. As a result, the sealing resin 61u can suppress stresses and strains generated in the connection sections and the bonded sections of the wires 150 by sealing the connection sections, the wires 150, and the like, and therefore can improve the reliability of the semiconductor module 1.

As illustrated in FIG. 2, the laminated substrate 14v arranged in the housing section 111v and the sealing resin 61v formed in the housing section 111v have the same states as the states of the laminated substrate 14u and the sealing resin 61u in the housing section 111u. Therefore, the sealing resin 61v is also formed in gaps among the positive electrode section pattern 41, the negative electrode section pattern 42, and the output section pattern 43 formed on the insulating substrate 141 of the laminated substrate 14v. As a result, the sealing resin 61v can improve the insulation properties in the laminated substrate 14v. The sealing resin 61v is formed in the housing section 111v in a state of covering metal parts, such as the connection section 311 of each of the gate signal output terminals 31va, 31vb, the connection section 321 of each of the reference signal output terminals 32va, 32vb, the connection sections used for the electrical connection in the inverter circuit 15v, and the wires 150. As a result, the sealing resin 61v can suppress stresses and strains generated in the connection sections and the bonded sections of the wires 150 by sealing the connection sections, the wires 150, and the like, and therefore can improve the reliability of the semiconductor module 1.

As illustrated in FIG. 2, the laminated substrate 14$w$ arranged in the housing section 111$w$ and the sealing resin 61$w$ formed in the housing section 111$w$ have the same states as the states of the laminated substrate 14$u$ and the sealing resin 61$u$ in the housing section 111$u$. Therefore, the sealing resin 61$w$ is also formed in gaps among the positive electrode section pattern 41, the negative electrode section pattern 42, and the output section pattern 43 formed on the insulating substrate 141 of the laminated substrate 14$w$. As a result, the sealing resin 61$w$ can improve the insulation properties in the laminated substrate 14$w$. The sealing resin 61$w$ is formed in the housing section 111$w$ in a state of covering metal parts, such as the connection section 311 of each of the gate signal output terminals 31$wa$, 31$wb$, the connection section 321 of each of the reference signal output terminals 32$wa$, 32$wb$, the connection sections used for the electrical connection in the inverter circuit 15$w$, and the wires 150. As a result, the sealing resin 61$w$ can suppress stresses and strains generated in the connection sections and the bonded sections of the wires 150 by sealing the connection sections, the wires 150, and the like, and therefore can improve the reliability of the semiconductor module 1.

Figure 3:
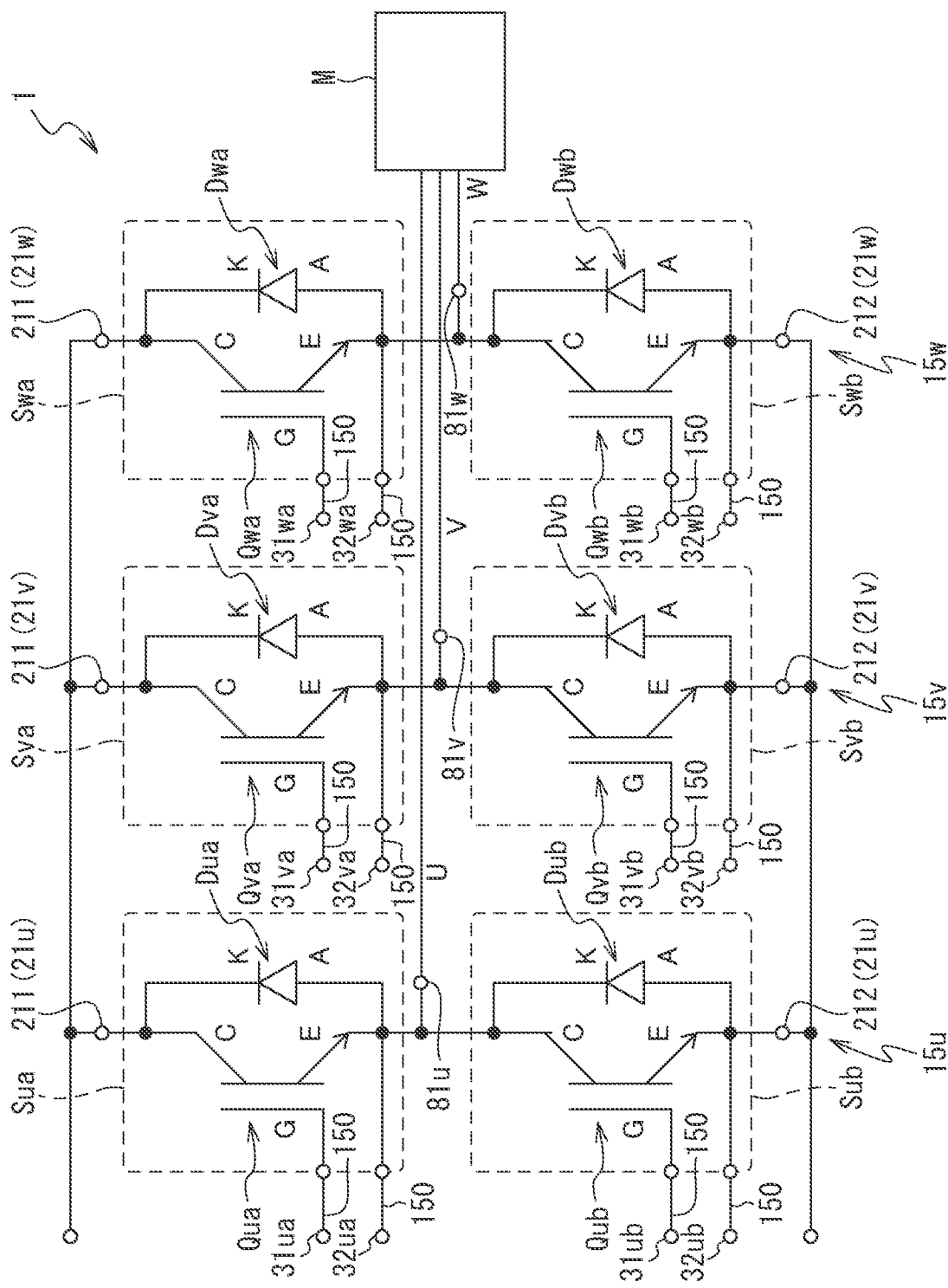
FIG. 3 is a circuit diagram illustrating an example of inverter circuits provided in the semiconductor module according to one embodiment of the present invention.

Next, the circuit configurations of the inverter circuits 15$u$, 15$v$, 15$w$ provided in the semiconductor module 1 are described using FIG. 3.

As illustrated in FIG. 3, the inverter circuit 15$u$ provided in the semiconductor module 1 includes the semiconductor element Sua and the semiconductor element Sub connected in series between the positive electrode terminal 211 and the negative electrode terminal 212 of the power input terminal 21$u$. A connection section between the semiconductor element Sua and semiconductor element Sub is connected to the power output terminal 81$u$ from which the U-phase AC power is output. In the inverter circuit 15$u$, the semiconductor element Sua constitutes an upper arm of the U-phase AC power, and the semiconductor element Sub constitutes a lower arm of the U-phase AC power.

The inverter circuit 15$v$ provided in the semiconductor module 1 includes the semiconductor element Sva and the semiconductor element Svb connected in series between the positive electrode terminal 211 and the negative electrode terminal 212 of the power input terminal 21$v$. A connection section between the semiconductor element Sva and the semiconductor element Svb is connected to the power output terminal 81$v$ from which the V-phase AC power is output. The semiconductor element Sva constitutes an upper arm of the V-phase AC power, and the semiconductor element Svb constitutes a lower arm of the V-phase AC power.

The inverter circuit 15$w$ provided in the semiconductor module 1 includes the semiconductor element Swa and the semiconductor element Swb connected in series between the positive electrode terminal 211 and the negative electrode terminal 212 of the power input terminal 21$w$. A connection section between the semiconductor element Swa and the semiconductor element Swb is connected to the power output terminal 81$w$ from which the W-phase AC power is output. The semiconductor element Swa constitutes an upper arm of the W-phase AC power, and the semiconductor element Swb constitutes a lower arm of the W-phase AC power.

As illustrated in FIG. 3, the semiconductor element Sua has a transistor Qua, which is an insulated gate bipolar transistor (IGBT), for example, and a free wheeling diode Dua connected in antiparallel to the transistor Qua. The transistor Qua and the free wheeling diode Dua are formed on one semiconductor substrate and made into one chip, for example. The semiconductor element Sub has a transistor Qub, which is the IGBT, for example, and a free wheeling diode Dub connected in antiparallel to the transistor Qub. The transistor Qub and the free wheeling diode Dub are formed on one semiconductor substrate and made into one chip, for example.

A collector C of the transistor Qua and a cathode K of the free wheeling diode Dua are connected to each other and connected to the positive electrode terminal 211 of the power input terminal 21$u$. An emitter E of the transistor Qua and an anode A of the free wheeling diode Dua are connected to each other. A collector C of the transistor Qub and a cathode K of the free wheeling diode Dub are connected to each other. The emitter E of the transistor Qua and the anode A of the free wheeling diode Dua, and the collector C of the transistor Qub and the cathode K of the free wheeling diode Dub are connected to each other and connected to the power output terminal 81$u$. An emitter E of the transistor Qub and an anode A of the free wheeling diode Dub are connected to each other and connected to the negative electrode terminal 212 of the power input terminal 21$u$.

A gate G of the transistor Qua is connected to the connection section 311 (see FIG. 1) of the gate signal output terminal 31$ua$ by the wire 150. The emitter E of the transistor Qua is connected to the connection section 321 (see FIG. 1) of the reference signal output terminal 32$ua$ by the wire 150.

As illustrated in FIG. 3, the semiconductor element Sva has a transistor Qva, which is the IGBT, for example, and a free wheeling diode Dva connected in antiparallel to the transistor Qva. The transistor Qva and the free wheeling diode Dva are formed on one semiconductor substrate and made into one chip, for example. The semiconductor element Svb has a transistor Qvb, which is the IGBT, for example, and a free wheeling diode Dvb connected in antiparallel to the transistor Qvb. The transistor Qvb and the free wheeling diode Dvb are formed on one semiconductor substrate and made into one chip, for example.

A collector C of the transistor Qva and a cathode K of the free wheeling diode Dva are connected to each other and connected to the positive electrode terminal 211 of the power input terminal 21$v$. An emitter E of the transistor Qva and an anode A of the free wheeling diode Dva are connected to each other. A collector C of the transistor Qvb and a cathode K of the free wheeling diode Dvb are connected to each other. The emitter E of the transistor Qva and the anode A of the free wheeling diode Dva, and the collector C of the transistor Qvb and the cathode K of the free wheeling diode Dvb are connected to each other and connected to the power output terminal 81$v$. An emitter E of the transistor Qvb and an anode A of the free wheeling diode Dvb are connected to each other and connected to the negative electrode terminal 212 of the power input terminal 21$v$.

A gate G of the transistor Qva is connected to the connection section 311 (see FIG. 1) of the gate signal output terminal 31$va$ by the wire 150. The emitter E of the transistor Qva is connected to the connection section 321 (see FIG. 1) of the reference signal output terminal 32$va$ by the wire 150.

As illustrated in FIG. 3, the semiconductor element Swa has a transistor Qwa, which is the IGBT, for example, and a free wheeling diode Dwa connected in antiparallel to the transistor Qwa. The transistor Qwa and the free wheeling diode Dwa are formed on one semiconductor substrate and made into one chip, for example. The semiconductor element Swb has a transistor Qwb, which is the IGBT, for example, and a free wheeling diode Dwb connected in antiparallel to the transistor Qwb. The transistor Qwb and the free wheeling diode Dwb are formed on one semiconductor substrate and made into one chip, for example.

A collector C of the transistor Qwa and a cathode K of the free wheeling diode Dwa are connected to each other and connected to the positive electrode terminal 211 of the power input terminal 21w. An emitter E of the transistor Qwa and an anode A of the free wheeling diode Dwa are connected to each other. A collector C of the transistor Qwb and a cathode K of the free wheeling diode Dwb are connected to each other. The emitter E of the transistor Qwa and the anode A of the free wheeling diode Dwa, and the collector C of the transistor Qwb and the cathode K of the free wheeling diode Dwb are connected to each other and connected to the power output terminal 81w. An emitter E of the transistor Qwb and an anode A of the free wheeling diode Dwb are connected to each other and connected to the negative electrode terminal 212 of the power input terminal 21w.

A gate G of the transistor Qwa is connected to the connection section 311 (see FIG. 1) of the gate signal output terminal 31wa by the wire 150. The emitter E of the transistor Qwa is connected to the connection section 321 (see FIG. 1) of the reference signal output terminal 32wa by the wire 150.

The gate pulse signal output from the control circuit (not illustrated) is input into the gate G of the transistor Qua provided in the semiconductor element Sua and a DC reference signal output from the control circuit is input into the emitter E of the transistor Qua provided in the semiconductor element Sua. Therefore, a potential difference between the potential of the gate pulse signal and the potential of the reference signal is applied as a gate-emitter voltage to the transistor Qua.

To the transistor Qub provided in the semiconductor element Sub, the potential difference between the potential of the gate pulse signal output from the control circuit and the potential of the reference signal is applied as the gate-emitter voltage. To the transistor Qva provided in the semiconductor element Sva, the potential difference between the potential of the gate pulse signal output from the control circuit and the potential of the reference signal is applied as the gate-emitter voltage. To the transistor Qvb provided in the semiconductor element Svb, the potential difference between the potential of the gate pulse signal output from the control circuit and the potential of the reference signal is applied as the gate-emitter voltage. To the transistor Qwa provided in the semiconductor element Swa, the potential difference between the potential of the gate pulse signal output from the control circuit and the potential of the reference signal is applied as the gate-emitter voltage. To the transistor Qwb provided in the semiconductor element Swb, the potential difference between the potential of the gate pulse signal output from the control circuit and the potential of the reference signal is applied as the gate-emitter voltage.

The transistors Qua, Qub, Qva, Qvb, Qwa, Qwb are turned on when the voltage level of the gate pulse signal is high and turned off when the voltage level of the gate pulse signal is low, for example. Although a detailed description is omitted, the transistors Qua, Qub provided in the inverter circuit 15u, the transistors Qva, Qvb provided in the inverter circuit 15v, and the transistors Qwa, Qwb provided in the inverter circuit 15w are repeatedly turned on and turned off at predetermined timings and in predetermined combinations. Thus, the semiconductor module 1 can supply, to the motor M, the U-phase AC power, the V-phase AC power, and the W-phase AC power, whose phases are shifted from one another by a predetermined amount, from the power output terminals 81u, 81v, 81w of the inverter circuits 15u, 15v, 15w, respectively.

(Configuration of Partition Section)

Figure 4:
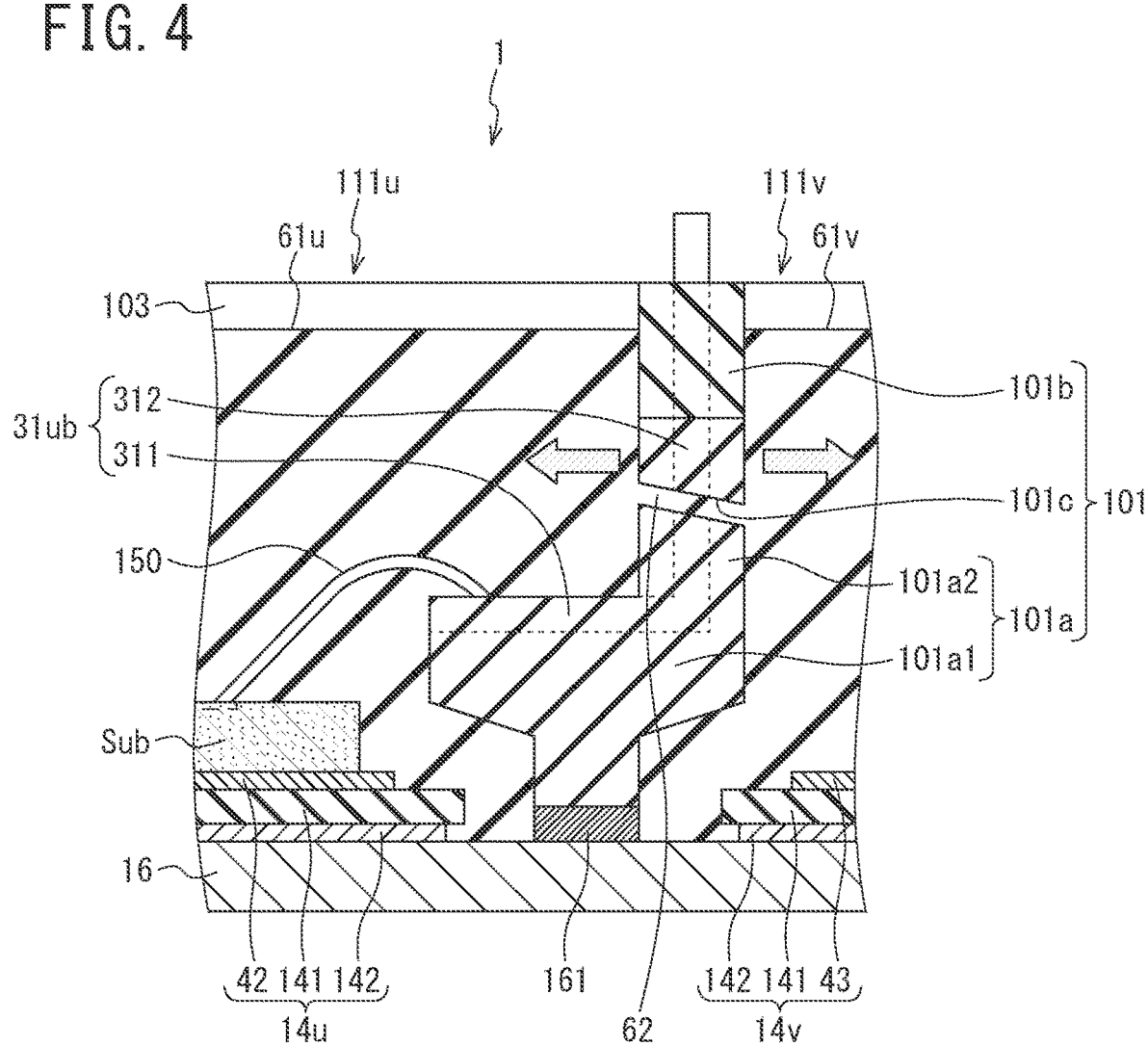
FIG. 4 is a diagram for explaining a partition section provided in the semiconductor module according to one embodiment of the present invention and is a cross-sectional view illustrating the vicinity of the partition section illustrated in FIG. 2 in an enlarged manner.

Next, the configurations of the partition sections 101, 102 provided in the semiconductor module 1 according to this embodiment are described using FIG. 4 referring to FIG. 1 to FIG. 3. In FIG. 4, the hidden line of the gate signal output terminal 31ub is illustrated by the broken line. The partition section 101 and the partition section 102 have the same configuration. Therefore, the configurations of the partition sections 101, 102 are described taking the partition section 101 as an example.

As illustrated in FIG. 4, the partition section 101 has a through hole 101c where a sealing resin 62 is formed (see FIG. 2), the through hole 101c connecting the housing section 111u and the housing section 111v adjacent to each other and the sealing resin 62 formed in the through hole 101c being continuous with the sealing resin 61u (see FIG. 2) formed in the housing section 111u and the sealing resin 61v (see FIG. 2) formed in the housing section 111v. The partition section 101 has a first member 101a where the through hole 101c is formed and which is separate from the outer frame 103, and a second member 101b where the through hole 101c is not formed and which is integrated with the outer frame 103. The second member 101b is fixed to the first member 101a.

The first member 101a has a base section 101a1 fixed to the cooler 16 and a wall section 101a2 projecting from the base section 101a1. The base section 101a1 and the wall section 101a2 are integrally formed with each other. The wall section 101a2 is arranged on the base section 101a1 to be closer to the housing section 111v side of the base section 101a1. The through hole 101c is formed in the first member 101a, and more specifically formed in the wall section 101a2.

The second member 101b is arranged on the first member 101a to be contact with the wall section 101a2. The second member 101b is formed in a wall shape having substantially the same thickness as that of the wall section 101a2. The second member 101b is arranged to cover the upper surface of the first member 101a from which the input section 312 of the gate signal output terminal 31ub projects and the side surface of the first member 101a facing each of the outer frames 103 where the power input terminal 21u and the power output terminal 81u are arranged. More specifically, the second member 101b is arranged to cover the three consecutive side surfaces of the wall section 101a2. Thus, the partition section 101 has a bent shape. The partition section 101 has an L-shaped cross section orthogonal to the extension direction.

As illustrated in FIG. 4, the through hole 101c is tilted such that the opening on the side where the connection section 311 is arranged is higher than the opening on the side where the connection section 311 is not arranged. In other words, the through hole 101c formed in the partition section 101 is formed to be tilted such that the opening on the housing section 111u side is higher than the opening on the housing section 111v side. Herein, the reference for the height of the opening of the through holes 101c is the position where the partition section 101 contacts the cooler 16. All the through holes 101c formed in the partition section 101 are tilted at substantially the same angle. As described above, since the through holes 101c are tilted, bubbles are removed when the sealing resins 61u, 61v formed in the housing sections 111u, 111v, respectively, enter the through hole 101c to form the sealing resin 62. This prevents the formation of cavities due to the bubbles in the sealing resin 62.

The through hole 101c is formed in a columnar shape, for example. The through hole 101c has a diameter of 1 mm or more and 3 mm or less, for example. However, the plurality of through holes 101c is not limited to the columnar shape, and may be formed in another shape, such as a prism shape. In this embodiment, the through hole 101c has a substantially constant diameter, but may have a truncated cone shape having a diameter increasing from the side where the connection section 311 is arranged (housing section 111u side) to the side where the connection section 311 is not arranged (housing section 111v side), for example. The through hole 101c may have a truncated pyramid shape widening from the side where the connection section 311 is arranged (housing section 111u side) to the side where the connection section 311 is not arranged (housing section 111v side), for example.

Each of the openings of the plurality of through holes 101c is arranged in a direction orthogonal to the surface where the connection sections 311, 321 are arranged. Each of the openings of the plurality of through holes 101c is provided in the wall section 101a2 formed in the wall shape of the first member 101a of the partition section 101. Therefore, one opening of the plurality of through holes 101c becomes an opening section opening a part of the side wall of the housing section 111u, and the other opening of the plurality of through holes 101c becomes an opening section opening a part of the side wall of the housing section 111v. Thus, the plurality of through holes 101c forms a cavity connecting the housing section 111u and the housing section 111v adjacent to each other. As a result, when the sealing resins 61u, 61v are formed in the housing sections 111u, 111v, respectively, the sealing resin 61u entering through one opening of the plurality of through holes 101c and the sealing resin 61v entering through the other opening of the plurality of through hole 101c come in contact with each other and are solidified inside each of the plurality of through holes 101c to form the sealing resin 62. Thus, the sealing resin 62 is formed by a part of the sealing resin 61u and a part of the sealing resin 61v.

Due to the formation of the sealing resin 62 in a state of filling the plurality of through holes 101c, the sealing resin 62 formed in the plurality of through holes 101c provided in the partition section 101, and the sealing resin 61u formed in the housing section 111u and the sealing resin 61v formed in the housing section 111v are integrated into a continuous resin.

As described above, the semiconductor element Sua, and the gate signal output terminal 31ua and the reference signal output terminal 32ua are connected by wire bonding. The semiconductor element Sub, and the gate signal output terminal 31ub and the reference signal output terminal 32ub are connected by wire bonding. Therefore, the connection section 311 of the gate signal output terminal 31ua and the connection section 321 of the reference signal output terminal 32ua are bonded sections between the semiconductor element Sua and the wires 150. Similarly, the connection section 311 of the gate signal output terminal 31ub and the connection section 321 of the reference signal output terminal 32ub are bonded sections between the semiconductor element Sub and the wires 150.

Although details are described later, when a temperature load is applied to the semiconductor module 1, so that the sealing resin of the semiconductor module 1 is deformed, tensile stresses in the opposite directions are generated on the side where the connection section 311 is arranged (hereinafter, sometimes referred to as "connection section side") and on the side where the connection section 311 is not arranged (hereinafter, sometimes referred to as "rear surface side") in the partition section 101 as illustrated by the thick arrows in FIG. 4. More specifically, tensile stresses in the opposite directions are applied to both the surfaces of the partition section 101. As a result, the sealing resins 61u, 61v are subjected to a force of being peeled from partition section 101. In the through holes 101c of the partition section 101, the sealing resin 62 integrated with the sealing resins 61u, 61v is formed. The strength with which the sealing resins 61u, 61v and the sealing resin 62 maintain the integrated state is higher than the force with which the sealing resins 61u, 61v are peeled from the partition section 101 due to the tensile stresses generated in the partition section 101. This prevents the peeling of the sealing resins 61u, 61v from the partition section 101, and therefore the break in the wire 150 at the connection section 311 of the gate signal output terminal 31ub arranged in the partition section 101 can be prevented.

The partition section 102 has the same structure as that of the partition section 101. As illustrated in FIG. 2, the partition section 102 has the through hole 102c where the sealing resin 63 is formed, the through hole 102c connecting the housing section 111v and the housing section 111w adjacent to each other and the sealing resin 63 formed in through hole 102c being continuous with the sealing resin 61v formed in the housing section 111v and the sealing resin 61w formed in housing section 111w. The partition section 102 has a first member 102a where the through hole 102c is formed and is separate from the outer frame 103 and a second member 102b where the through hole 102c is not formed and is integrated with the outer frame 103. The second member 102b is fixed to the first member 102a.

The first member 102a has a base section 102a1 fixed to the cooler 16 and a wall section 102a2 projecting from the base section 102a1. The base section 102a1 and the wall section 102a2 are integrally formed with each other. The wall section 102a2 is arranged on the base section 102a1 to be closer to the housing section 111w side of the base section 102a1. The through hole 102c is formed in the first member 102a, and more specifically formed in the wall section 102a2.

As illustrated in FIG. 1 and FIG. 2, the first member 102a has the same shape as that of the first member 101a of the partition section 101, and the second member 102b has the same shape as that of the second member 101b of the partition section 101. Therefore, in the partition section 102, the gate signal output terminals 31va, 31vb and the reference signal output terminals 32va, 32vb are arranged in a state of being bent along the bent shape of the partition section 102 as with the gate signal output terminal 31ua and the like arranged in the partition section 101.

The through hole 102c is formed in the partition section 102 in such a manner to avoid the gate signal output terminals 31va, 31vb and the reference signal output terminals 32va, 32vb. The partition section 102 has two or more of the through holes 102c. Each of the plurality of through holes 102c is formed in the wall section 102a2 of the first member 102a.

The through hole 102c is tilted such that the opening on the side where the connection section 311 is arranged is higher than the opening on the side where the connection section 311 is not arranged. In other words, the through hole 102c formed in the partition section 102 is formed to be tilted such that the opening on the housing section 111v side is higher than the opening on the housing section 111w side.

Herein, the reference for the height of the opening of the through hole 102c is the position where the partition section 102 contacts the cooler 16. All the through holes 102c formed in the partition section 102 are tilted at substantially the same angle. As described above, since the through hole 102c is tilted, bubbles are removed when the sealing resins 61v, 61w formed in the housing sections 111v, 111w, respectively, enter the through hole 102c to form the sealing resin 63. This prevents the formation of cavities due to the bubbles in the sealing resin 63.

In this embodiment, the through hole 102c has the same shape as that of the through hole 101c, but may have a different shape. Each of the openings of the plurality of through holes 102c is arranged in a direction orthogonal to the surface where the connection sections 311, 321 are arranged. Each of the openings of the plurality of through holes 102c is provided in the wall section 102a2 formed in the wall shape of the first member 102a of the partition section 102. Therefore, one opening of the plurality of through holes 102c becomes an opening section opening a part of the side wall of the housing section 111v, and the other opening of the plurality of through holes 102c becomes an opening section opening a part of the side wall of the housing section 111w. Thus, the plurality of through holes 102c forms a cavity connecting the housing section 111v and the housing section 111w adjacent to each other. As a result, when the sealing resins 61v, 61w are formed in the housing sections 111v, 111w, respectively, the sealing resin 61v entering through one opening of the plurality of through holes 102c and the sealing resin 61w entering through the other opening of the plurality of through hole 102c come in contact with each other and are solidified inside each of the plurality of through holes 102c to form the sealing resin 63. Thus, the sealing resin 63 is formed by a part of the sealing resin 61v and a part of the sealing resin 61w.

Due to the formation of the sealing resin 63 in a state of filling the plurality of through holes 102c, the sealing resin 63 formed in the plurality of through holes 102c provided in the partition section 102, and the sealing resin 61v formed in the housing section 111v and the sealing resin 61w formed in the housing section 111w are integrated into a continuous resin. The strength with which the sealing resins 61v, 61w and the sealing resin 63 maintain the integrated state is higher than the force with which the sealing resins 61v, 61w are peeled from the partition section 102. This prevents the peeling of the sealing resins 61v, 61w from the partition section 102 even when a temperature load is applied to the semiconductor module 1, so that the semiconductor module 1 is deformed. As a result, the break in the wires 150 in the connection section 311 of each of the gate signal output terminals 31va, 31vb and the connection section 321 of each of the reference signal output terminals 32va, 32wb arranged in the partition section 102 can be prevented.

As illustrated in FIG. 2, the shape of the terminal arrangement region 103a of the outer frame 103 where the gate signal output terminals 31wa, 31wb and the reference signal output terminals 32wa, 32wb connected to the laminated substrate 14w are arranged has a bent shape as with the partition sections 101, 102. Therefore, the gate signal output terminals 31wa, 31wb and the reference signal output terminals 32wa, 32wb are arranged in the outer frame 103 in a bent state along the bent shape of the terminal arrangement region 103a of the outer frame 103.

In the terminal arrangement region 103a of the outer frame 103, the side where the connection sections 311, 321 are not arranged is the outside, on which the sealing resin is not formed. Therefore, even when the semiconductor module 1 is deformed based on the temperature load, tensile stresses from both the surfaces are not generated in the terminal arrangement region 103a, unlike the partition sections 101, 102. Thus, when the semiconductor module 1 is deformed, a tensile stress from the sealing resin 61w formed in the housing section 111w is less likely to be transmitted to the wires 150 (not illustrated) bonded to the connection sections 311, 321 arranged in the terminal arrangement region 103a. Therefore, in this embodiment, no through holes are formed in the terminal arrangement area 103a of the outer frame 103.

(Actions/Effects of Partition Section)

Next, the actions and the effects of the partition sections 101, 102 provided in the semiconductor module 1 are described using FIG. 1 to FIG. 4.

In the semiconductor module 1 according to this embodiment, the case 10 and the cooler 16 are fixed to each other in the state where the laminated substrates 14u, 14v, 14w soldered to the cooler 16 are housed in the housing sections 111u, 111v, 111w, respectively, as described above. Further, the sealing resins 61u, 61v, 61w are formed in the housing sections 111u, 111v, 111w to cover the laminated substrates 14u, 14v, 14w, respectively, and the like (see FIG. 2). The cooler 16 is made of aluminum, for example, and the insulating substrate 141 provided on each of the laminated substrates 14u, 14v, 14w is made of ceramic, for example. Therefore, the linear expansion coefficient of the cooler 16 is about 7 to 8 times larger than the linear expansion coefficient of the insulating substrate 141.

In the semiconductor module 1, a thermal shock test is carried out as part of a reliability test. In the thermal shock test, a temperature load is applied to the semiconductor module 1, and, due to a difference in the linear expansion coefficient between the cooler 16 and the sealing resins 61u, 61v, 61w, the sealing resins 61u, 61v, 61w expand when heated and the sealing resins 61u, 61v, 61w shrink when cooled, in the longitudinal direction of the case 10 in the semiconductor module 1. Therefore, a stress is applied between the partition section 101 and the sealing resins 61u, 61v, and a stress is applied between the partition section 102 and the sealing resins 61v, 61w. In particular, during the cooling, the partition section 101 is subjected to tensile stresses on both the surfaces and the partition section 102 is also subjected to tensile stresses on both the surfaces as illustrated by the thick straight arrows in FIG. 2. Thus, the sealing resin 61u is subjected to a force in a direction of being peeled from the partition section 101, the sealing resin 61v is subjected to a force in a direction of being peeled from the partition sections 101, 102, and the sealing resin 61w is subjected to a force in a direction of being peeled from the partition section 102. Further, the semiconductor module 1 is deformed also by the shrinkage of the sealing resins 61u, 61v, 61w by cooling in the formation of the sealing resins 61u, 61v, 61w, and the tensile stresses from the sealing resins 61u, 61v, 61w are applied to the partition sections 101, 102 in some cases, without being limited to the thermal shock test.

The simulation analysis of section disassembly analysis results of partition sections and a tensile stress applied to the partition sections of a conventional semiconductor module was performed. The analyzed conventional semiconductor module has a structure similar to that of the semiconductor module 1 according to this embodiment, except that no through holes are formed in the partition sections.

It was confirmed by the simulation analysis of the tensile stress that the tensile stresses in the opposite directions were applied to the connection section side and the rear surface side of the partition section. In the section disassembly analysis, the peeling between the partition section and a sealing resin was confirmed in either the connection section side or the rear surface side of the partition section. However, the peeling of the sealing resin from the connection section side and the peeling of the sealing resin from the rear surface side did not occur at the same time.

Connection sections of control terminals (i.e., gate signal output terminals and reference signal output terminals) exposed to the connection section side and wires connected to the connection sections are covered with the sealing resin. In other words, the connection sections and the wires bonded to the connection sections are embedded in the sealing resin and fixed to the sealing resin. Therefore, when the conventional semiconductor module provided with the partition section is deformed in the forward warping direction and the sealing resin is peeled from the connection section side of the partition section, the wires embedded in the sealing resin are subjected to a force in a direction away from the partition section. As a result, the wires are subjected to a force in a direction away from the connection sections of the control terminals arranged in the partition section, so that the wires are broken in the connection sections, causing open defects in the conventional semiconductor module in some cases. When the wires are broken, a gate pulse signal and a reference signal are not input into an inverter circuit from a control circuit, and therefore the conventional semiconductor module does not perform predetermined operations and cannot supply power to a motor, for example, to be driven.

In contrast thereto, in the semiconductor module 1 according to this embodiment, the sealing resin 61$u$ and the sealing resin 61$v$ are connected by the sealing resin 62 formed in each of the plurality of through holes 101$c$ formed in the partition section 101. Further, the sealing resin 61$u$, the sealing resin 62, and the sealing resin 61$v$ are integrally formed with one another. Therefore, the adhesiveness between the partition section 101 and the sealing resin 61$u$ and the adhesiveness between the partition section 101 and the sealing resin 61$v$ are improved as compared with a case where the through holes 101$c$ are not formed. The adhesiveness between the partition section 101 and each of the sealing resin 61$u$ and the sealing resin 61$v$ is determined by the base material which is the formation material of the sealing resin 62 formed in the through holes 101$c$. To the tensile stress applied to the partition section 101 accompanying the deformation of the semiconductor module 1, the base material of the sealing resin 62 has strength higher than the adhesion force between the partition section 101 and each of the sealing resin 61$u$ and the sealing resin 61$v$ when the through holes 101$c$ are not formed. As a result, even when the sealing resins 61$u$, 61$v$, 61$w$ of the semiconductor module 1 shrink, the peeling of the sealing resins 61$u$, 61$v$ from the partition section 101 is prevented, and therefore the semiconductor module 1 can prevent the break in the wires 150 in the connection sections 311, 321 exposed to the partition section 101.

Similarly, the sealing resin 61$v$ and the sealing resin 61$w$ are connected by the sealing resin 63 formed in each of the plurality of through holes 102$c$ formed in the partition section 102. Further, the sealing resin 61$v$, the sealing resin 63, and the sealing resin 61$w$ are integrally formed with one another. The adhesiveness between the partition section 102 and the sealing resin 61$v$ and the adhesiveness between the partition section 102 and the sealing resin 61$w$ are improved as compared with a case where the through holes 102$c$ are not formed. The adhesiveness between the partition section 102 and each of the sealing resin 61$v$ and the sealing resin 61$w$ is determined by the base material which is the formation material of the sealing resin 63 formed in the through holes 102$c$. To the tensile stress applied to the partition section 102 accompanying the deformation of the semiconductor module 1, the base material of the sealing resin 63 has strength higher than the adhesion force between the partition section 102 and each of the sealing resin 61$v$ and the sealing resin 61$w$ when the through holes 102$c$ are not formed. As a result, even when the sealing resins 61$u$, 61$v$, 61$w$ of the semiconductor module 1 shrink, the peeling of the sealing resins 61$v$, 61$w$ from the partition section 102 is prevented, and therefore the semiconductor module 1 can prevent the break in the wires 150 in the connection sections 311, 321 exposed to the partition section 102.

The tensile stresses applied to the partition sections 101, 102 of the semiconductor module 1 vary depending on the size of the case 10. The larger the case 10, the higher the tensile stresses, for example. Therefore, by selecting a material having a strength capable of withstanding the tensile stresses and forming the sealing resins 61$u$, 61$v$, 61$w$ and the sealing resin 62, 63 according to the size of the case 10, the semiconductor module 1 can prevent the break in the wires 150 in the connection sections 311, 321 exposed to each of the partition sections 101, 102.

(Method for Manufacturing Semiconductor Module)

Figures 5A, 5B:
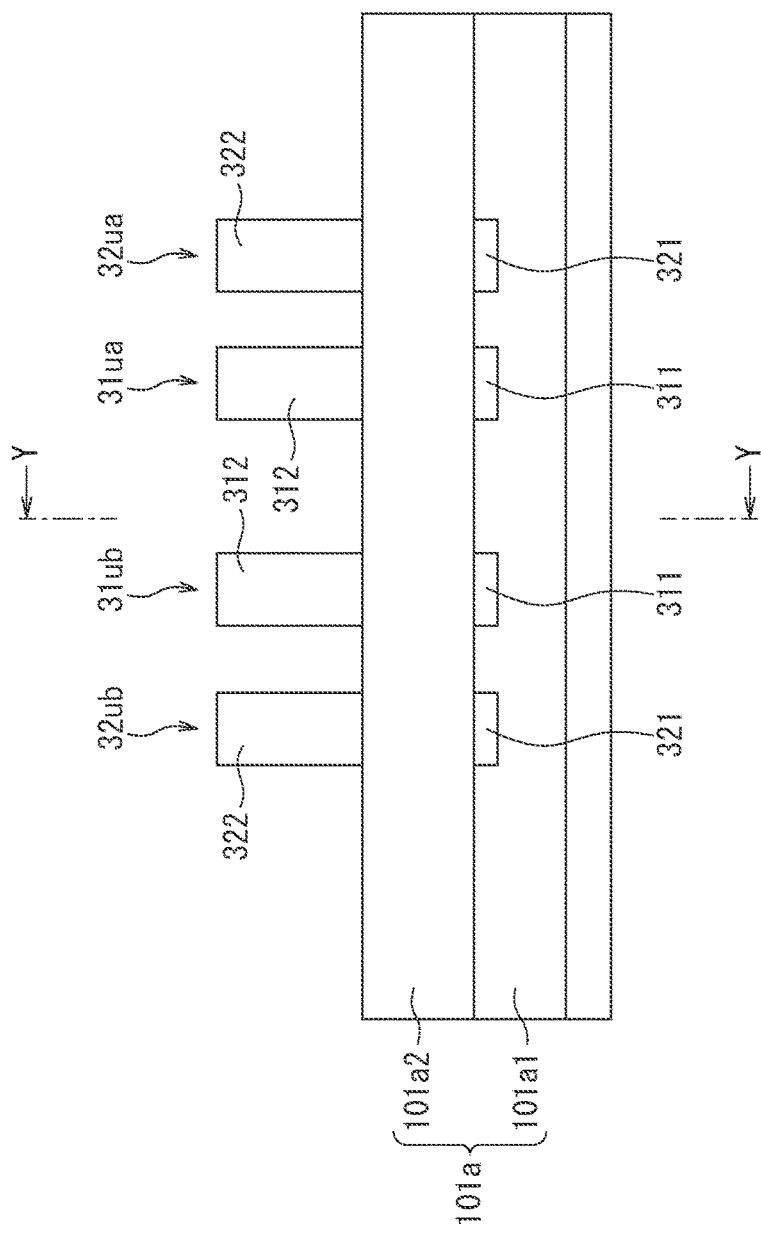
FIGS. 5A and 5B are diagrams (No. 1) for explaining a method for manufacturing a semiconductor module according to one embodiment of the present invention.

A method for manufacturing a semiconductor module according to this embodiment is described using FIG. 5A to FIG. 7 referring to FIG. 4. Methods for manufacturing the partition section 101 and the partition section 102 are the same. Therefore, the methods for manufacturing the partition section 101 and the partition section 102 are described taking the partition section 101 as an example. FIGS. 5A to 6B are diagrams for explaining a method for forming the first member 101$a$ provided in the partition section 101. FIG. 5A is a diagram when the first member 101$a$ before the formation of the through holes 101$c$ is viewed in a direction orthogonal to the wall section 101$a$2 from the connection section side. FIG. 5B is a cross-sectional view of the first member 101$a$ cut along the Y-Y line illustrated in FIG. 5A. FIG. 6A is a diagram when the first member 101$a$ after the formation of the through holes 101$c$ is viewed in the direction orthogonal to the wall section 101$a$2 from the connection section side. FIG. 6B is a cross-sectional view of the first member 101$a$ cut along the Y-Y line illustrated in FIG. 6A.

Figure 6B:
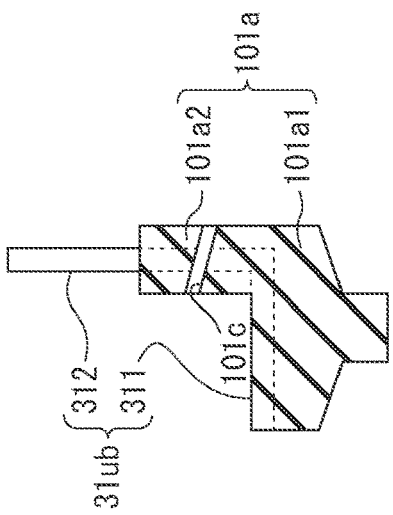
FIGS. 6A and 6B are diagrams (No. 2) for explaining the method for manufacturing a semiconductor module according to one embodiment of the present invention.
Figure 7:
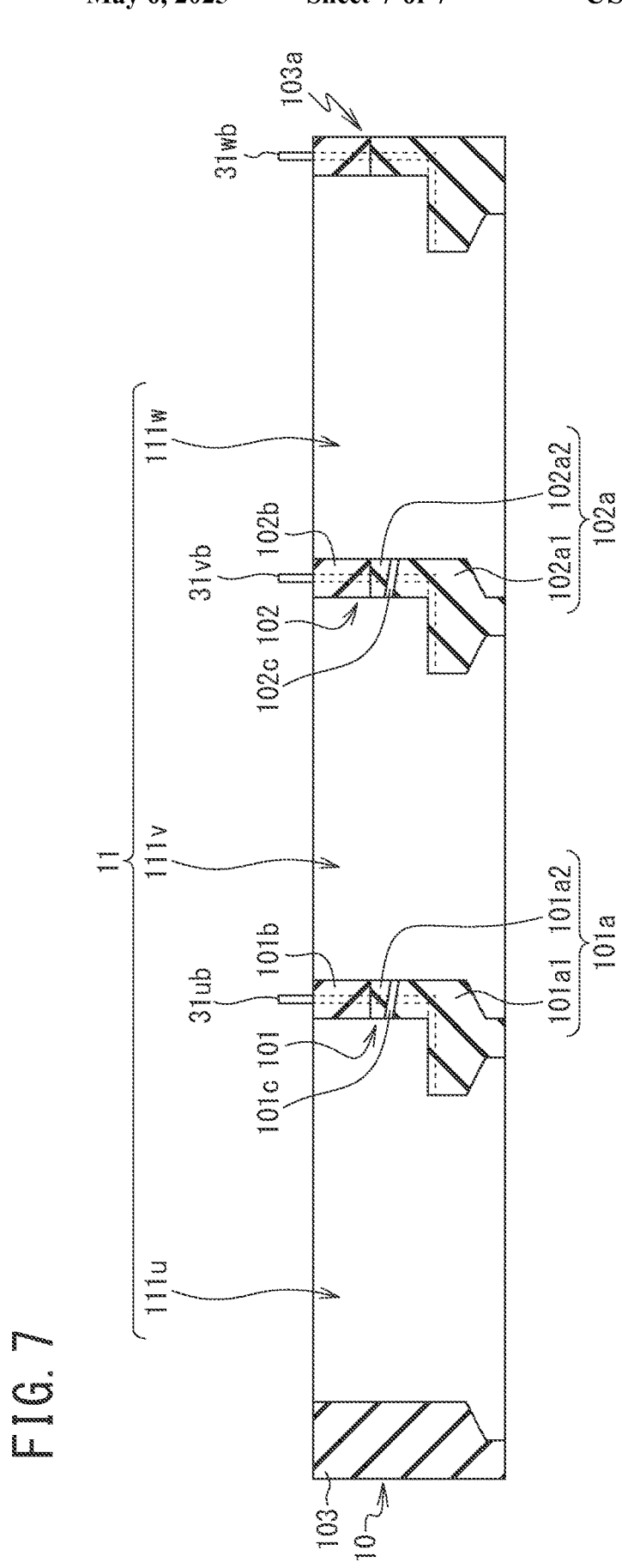
FIG. 7 is a diagram (No. 3) for explaining the method for manufacturing a semiconductor module according to one embodiment of the present invention.

In FIG. 5B and FIG. 6B, the hidden line of the gate signal output terminal 31$ub$ is illustrated by the broken lines. FIG. 7 is a diagram for explaining a method for forming the case 10 and is a cross-sectional view in which the case 10 is cut at a position corresponding to the X-X line illustrated in FIG. 1. In FIG. 7, the hidden lines of the gate signal output terminal 31$ub$, 31$vb$, 31$wb$ are illustrated by the broken lines.

As illustrated in FIGS. 5A and 5B, the method for manufacturing the semiconductor module 1 according to this embodiment includes first, forming the first member 101$a$ where the gate signal output terminals 31$ua$, 31$ub$ (an example of the control terminal) which are connected to the semiconductor elements Sua, Sub, respectively, (not illustrated in FIGS. 5A and 5B, see FIG. 1) and from which gate pulse signals (an example of the control signal) controlling the semiconductor elements Sua, Sub are output and the reference signal output terminals 32$ua$, 32$ub$ (an example of the control terminal) which are connected to the semiconductor elements Sua, Sub, respectively, (not illustrated in FIGS. 5A and 5B, see FIG. 1) and from which the reference signals are output are arranged.

The first member 101a is molded by insert molding including injecting a heated and melted thermoplastic resin into an injection molding mold where the gate signal output terminals 31ua, 31ub and the reference signal output terminals 32ua, 32ub are arranged, and integrating the arranged gate signal output terminals 31ua and the like with the resin.

Figure 6A:
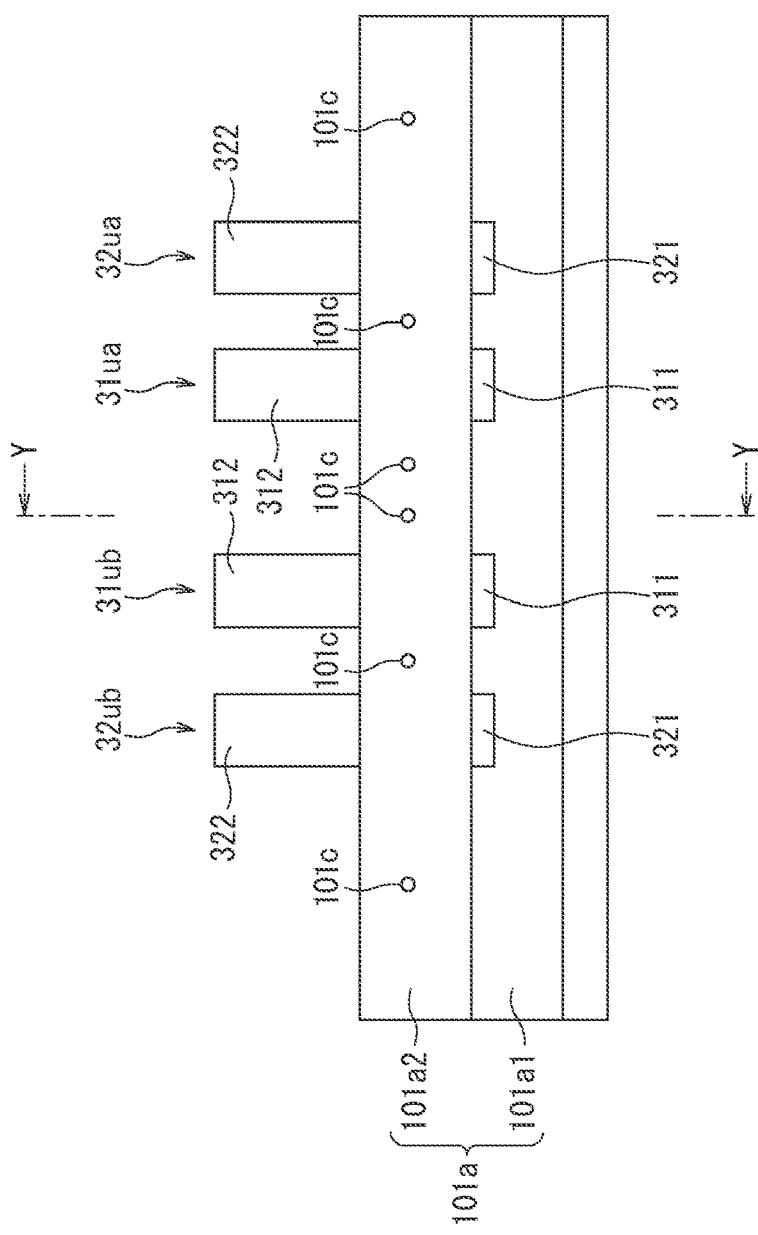

Next, as illustrated in FIGS. 6A and 6B, the through hole 101c penetrating the first member 101a is formed. The through hole 101c is formed by machining with a drill or the like, for example, after the first member 101a is formed. As illustrated in FIG. 6A, the through holes 101c are formed at a plurality of places (six places in this embodiment) in such manner to avoid the gate signal output terminals 31ua, 31ub and the reference signal output terminals 32ua, 32ub. As illustrated in FIG. 6B, the through hole 101c is formed to be tilted such that the opening on the connection section side is higher than the opening on the rear surface side.

The first member 102a constituting the partition section 102 is formed by the same method as that of the first member 101a. Further, a predetermined member is formed which is formed in the same shape as that of the first member 101a, except for the through holes 101c, and constitutes the terminal arrangement area 103a.

Next, the first member 101a where the through holes 101c are formed and the first member 102a where the through holes 102c are formed are set in an injection molding mold (an example of the predetermined mold). At that time, the predetermined member constituting the terminal arrangement area 103a is also set in the injection molding mold.

Next, as illustrated in FIG. 7, the resin is poured into the injection molding mold, and the outer frame 103 defining the space 11 where the semiconductor elements Sua, Sub, Sva, Svb, Swa, Swb (not illustrated in FIG. 7, see FIG. 1) are arranged and the partition sections 101, 102 integrally formed with the outer frame 103 and partitioning, together with the first members 101a, 102a, the space 11 into the plurality of housing sections 111u, 111v, 111w (an example of the plurality of regions). Simultaneously with the formation of the partition sections 101, 102, the terminal arrangement area 103a where the gate signal output terminals 31wa, 31wb and the reference signal output terminals 32wa, 32wb are arranged is also formed. Thus, the case 10 is formed.

Although not illustrated, the laminated substrates 14u, 14v, 14w and the cooler 16 are attached to the case 10, and then a resin for forming the sealing resins 61u, 61v, 61w is simultaneously injected into the housing sections 111u, 111v, 111w. Thus, in a process of filling the housing sections 111u, 111v, 111w with the sealing resins 61u, 61v, 61w, respectively, the sealing resins 61u, 61v enter the through holes 101c and the sealing resins 61v, 61w enter the through holes 102c. Thus, the formation of the sealing resins 61u, 61v, 61w in the housing sections 111u, 111v, 111w, respectively, is completed, and the formation of the sealing resin 62 in the plurality of through holes 101c and the sealing resin 63 in the plurality of through holes 102c is completed. Thus, the semiconductor module 1 is completed.

The conventional injection molding mold is divided into two types of an upper mold and a lower mold. Therefore, in the conventional injection molding mold, the shape can be provided only in the direction in which the upper mold and the lower mold are removed. Therefore, the conventional injection molding mold has a problem of difficulty in forming lateral through holes, such as the through holes 101c, 102c.

In contrast thereto, in this embodiment, the first members 101a, 102a where the through holes 101c, 102c are formed, respectively, are set in the injection molding mold for forming the case 10. Therefore, in this embodiment, the case 10 can be molded using an injection molding mold having a structure in which the mold is divided into two types of an upper mold and a lower mold. Although this increases the number of steps for forming the case 10 as compared with the number of steps for forming the case of the conventional semiconductor module, the case 10 can be formed without using a special method.

As described above, the semiconductor module 1 according to this embodiment includes: the outer frame 103 defining the space 11 where the plurality of semiconductor elements Sua, Sub, Sva, Svb, Swa, Swb is arranged; the sealing resins 61u, 61v, 61w formed in the space 11 to cover the plurality of semiconductor elements Sua to Swb; the gate signal output terminals 31ua, 31ub, 31va, 31vb, 31wa, 31wb which are connected to the semiconductor elements Sua to Swb and from which the gate pulse signals controlling the semiconductor elements Sua to Swb are output and the reference signal output terminals 32ua, 32ub, 32va, 32vb, 32wa, 32wb which are connected to the semiconductor elements Sua to Swb and from which the reference signals are output; and the partition sections 101, 102 laid across the outer frame 103 to partition the space 11 into the plurality of housing sections 111u, 111v, 111w, in the partition sections 101, 102 which the gate signal output terminals 31ua to 31wb and the reference signal output terminals 32ua to 32wb with the connection sections 311, 321, respectively, to the semiconductor elements Sua to Swb exposed are arranged. The partition section 101 has the through holes 101c where the sealing resin 62 is formed, the through holes 101c connecting the housing section 111u and the housing section 111v adjacent to each other and the sealing resin 62 formed in the through hole 101c being continuous with the sealing resin 61u (see FIG. 2) formed in the housing section 111u and the sealing resin 61v (see FIG. 2) formed in the housing section 111v. The partition section 102 has the through holes 102c where the sealing resin 63 (see FIG. 2) is formed, the through holes 102c connecting the housing section 111v and the housing section 111w adjacent to each other and the sealing resin 63 formed in the through hole 102c being continuous with the sealing resin 61v formed in the housing section 111v and the sealing resin 61w (see FIG. 2) formed in the housing section 111w.

The semiconductor module 1 according to this embodiment can maintain the adhesion state between the partition section 101 and the sealing resins 61u, 61v due to the strength of the base material of the sealing resin 62 in addition to the adhesion force between the partition section 101 and the sealing resins 61u, 61v by forming the sealing resin 62 integrated with the sealing resins 61u, 61v in the plurality of through holes 101c formed in the partition section 101. Similarly, the semiconductor module 1 can maintain the adhesion state between the partition section 102 and the sealing resins 61v, 61w due to the strength of the base material of the sealing resin 63 in addition to the adhesion force between the partition section 102 and the sealing resins 61v, 61w by forming the sealing resin 63 integrated with the sealing resins 61v, 61w in the plurality of through holes 102c formed in the partition section 102. Therefore, the semiconductor module 1 can maintain the adhesion state of the sealing resins 61u, 61v to the partition section 101 and the adhesion state of the sealing resins 61v, 61w to the partition section 102 by a stronger adhesion force than that when the plurality of through holes 101c, 102c are not provided. Thus, the semiconductor module 1 can prevent the peeling of the sealing resins 61u, 61v on the side where the connection sections 311 of the gate signal output terminals 31ua, 31ub, 31va, 31vb and the connection sections 321 of the reference signal output terminal 32ua, 32ub, 32va, 32vb, used for the connection to the semiconductor elements Sua, Sub, Sva, Svb, respectively, are arranged. As a result, the semiconductor module 1 can prevent the occurrence of open defects due to the break in the wires 150 in the connection sections 311, 321.

As described above, the method for manufacturing the semiconductor module 1 according to this embodiment includes: forming the first members 101a, 102a where the gate signal output terminals 31ua, 31ub, 31va, 31vb which are connected to the semiconductor elements Sua, Sub, Sva, Svb and from which the gate pulse signals controlling the semiconductor elements Sua, Sub Sva, Svb, respectively, are output and the reference signal output terminals 32ua, 32ub, 32va, 32vb which are connected to the semiconductor elements Sua, Sub, Sva, Svb, respectively, and from which the reference signals are output are arranged; forming the through holes 101c penetrating the first member 101a and the through holes 102c penetrating the first member 102a; setting the first members 101a, 102a in the injection molding mold; and pouring a resin into the injection molding mold to form the outer frame 103 defining the space 11 where the semiconductor elements Sua, Sub, Sva, Svb are arranged and the partition sections 101, 102 integrally formed with the outer frame 103 and partitioning the space 11 into the plurality of housing sections 111u, 111v, 111w together with the first members 101a, 102a.

According to the method for manufacturing the semiconductor module 1 according to this embodiment, the case 10 including the partition sections 101, 102 having the through holes 101c, 102c, respectively, can be formed by the insert molding using the injection molding mold. Thus, the manufactured semiconductor module 1 can prevent the occurrence of the open defects due to the break in the wires 150 in the connection sections 311, 321.

The present invention can be variously modified without being limited to the above-described embodiment.

In the above-described embodiment, the six through holes 101c are provided in the partition section 101 and the six through holes 102c are provided in the partition section 102, but the present invention is not limited thereto. One or two or more (other than six) through holes 101c, 102c may be formed in the partition sections 101, 102, respectively. The numbers of the through holes 101c and the through holes 102c may be the same or different from each other.

In the above-described embodiment, the plurality of through holes 101c is formed at substantially the same height (i.e., in a substantially straight line) and the plurality of through holes 102c is formed at substantially the same height (i.e., in a substantially straight line), but the present invention is not limited thereto. The plurality of through holes 101c may be formed at different heights in the partition section 101. Similarly, the plurality of through holes 102c may be formed at different heights in the partition section 102.

In the above-described embodiment, the through hole 101c is formed to be tilted in the partition section 101, but the through hole 101c may be formed without tilting in the partition section 101 such that the opening sections opening the connection section side and the rear surface side of the partition section 101 have the same height. Similarly, the through hole 102c may be formed in the partition section 102 without tilting such that the opening sections opening the connection section side and the rear surface side of the partition section 102 have the same height.

In the method for manufacturing the semiconductor module according to the above-described embodiment includes setting the first members 101a, 102a where the through holes 101c, 102c are formed, respectively, in the injection molding mold to form the case 10, but the present invention is not limited thereto. The semiconductor module 1 may be manufactured by forming the case 10, and then forming the through holes 101c, 102c by machining with a drill or the like at predetermined places in the partition sections 101, 102, respectively.

In the above-described embodiment, the transistors provided in the semiconductor elements contain the IGBT but may contain MOS transistors. The material of the semiconductor element may contain silicon or a wide bandgap semiconductor.

The technical scope of the present invention is not limited to the illustrated and described exemplary embodiments and also includes all embodiments producing effects equivalent to the effects targeted by the present invention. Further, the technical scope of the present invention is not limited to combinations of features of the invention defined by each claim and can be defined by any desired combination of specific features of all the disclosed features.

REFERENCE SIGNS LIST 1 semiconductor module
10 case
11 space
14u, 14v, 14w laminated substrate
15u, 15v, 15w inverter circuit
16 cooler
21u, 21v, 21w power input terminal
31ua, 31ub, 31va, 31vb, 31wa, 31wb gate signal output terminal
32ua, 32ub, 32va, 32vb, 32wa, 32wb reference signal output terminal
41 positive electrode section pattern
42 negative electrode section pattern
43 output section pattern
61u, 61v, 61w sealing resin
81u, 81v, 81w power output terminal
101, 102 partition section
101a, 102a first member
101a1, 102a1 base section
101a2, 102a2 wall section
101b, 102b second member
101c, 102c through hole
103 outer frame
103a terminal arrangement region
111u, 111v, 111w housing section
141 insulating substrate
142 heat transfer member
150 wire
161 adhesive
211 positive electrode terminal
212 negative electrode terminal
311, 321 connection section
312, 322 input section
Sua, Sub, Sva, Svb, Swa, Swb semiconductor element

The invention claimed is:
1. A semiconductor module comprising:
an outer frame defining a space where a plurality of semiconductor elements is arranged;

sealing resins formed in the space to cover the plurality of semiconductor elements;

control terminals connected to the semiconductor elements and configured to output control signals to the semiconductor elements, the control signals controlling the semiconductor elements; and a partition section laid across the outer frame to partition the space into a plurality of regions, in the partition section which the control terminals with connection sections to the semiconductor elements exposed are arranged, wherein the partition section has a through hole where a sealing resin is formed, the through hole connecting the adjacent regions and the sealing resin formed in the through hole being continuous with the sealing resins formed in the adjacent regions.

2. The semiconductor module according to claim 1, wherein the through hole is tilted such that an opening on a side where the connection section is arranged is higher than an opening on a side where the connection section is not arranged.

3. The semiconductor module according to claim 1, wherein the through hole is formed in the partition section in such a manner to avoid the control terminals.

4. The semiconductor module according to claim 1, wherein the partition section has two or more of the through holes.

5. The semiconductor module according to claim 1, wherein the partition section has a first member having the through hole and separate from the outer frame, and a second member not having the through hole and integrated with the outer frame.

6. The semiconductor module according to claim 1, wherein the through hole has a diameter of 1 mm or more and 3 mm or less.

7. The semiconductor module according to claim 1, wherein
the semiconductor element and the control terminal are connected by wire bonding, and
the connection section is a bonded section between the semiconductor element and a wire.

8. A method for manufacturing a semiconductor module having an outer frame defining a space where a plurality of semiconductor elements is arranged, sealing resins formed in the space to cover the plurality of semiconductor elements, control terminals connected to the semiconductor elements and configured to output control signals to the semiconductor elements, the control signals controlling the semiconductor elements, and a partition section laid across the outer frame to partition the space into a plurality of regions, in the partition section which the control terminals with connection sections to the semiconductor elements exposed are arranged, wherein the partition section has a through hole where a sealing resin is formed, the through hole connecting the adjacent regions and the sealing resin formed in the through hole being continuous with the sealing resins formed in the adjacent regions, the method comprising:

forming a first member where the control terminals connected to semiconductor elements and configured to output the control signals to the semiconductor elements, the control signals controlling the semiconductor elements, are arranged;

forming the through hole penetrating the first member;

setting the first member in a predetermined mold; and pouring the sealing resin into the mold to form an outer frame defining the space where the semiconductor elements are arranged and the partition section formed integrally with the outer frame and partitioning the space into the plurality of regions together with the first member.

9. The semiconductor module according to claim 2, wherein the through hole is formed in the partition section in such a manner to avoid the control terminals.

10. The semiconductor module according to claim 2, wherein the partition section has two or more of the through holes.

11. The semiconductor module according to claim 3, wherein the partition section has two or more of the through holes.

12. The semiconductor module according to claim 2, wherein the partition section has a first member having the through hole and separate from the outer frame, and a second member not having the through hole and integrated with the outer frame.

13. The semiconductor module according to claim 3, wherein the partition section has a first member having the through hole and separate from the outer frame, and a second member not having the through hole and integrated with the outer frame.

14. The semiconductor module according to claim 4, wherein the partition section has a first member having the through hole and separate from the outer frame, and a second member not having the through hole and integrated with the outer frame.

15. The semiconductor module according to claim 2, wherein the through hole has a diameter of 1 mm or more and 3 mm or less.

16. The semiconductor module according to claim 3, wherein the through hole has a diameter of 1 mm or more and 3 mm or less.

17. The semiconductor module according to claim 4, wherein the through hole has a diameter of 1 mm or more and 3 mm or less.

18. The semiconductor module according to claim 5, wherein the through hole has a diameter of 1 mm or more and 3 mm or less.

19. The semiconductor module according to claim 2, wherein
the semiconductor element and the control terminal are connected by wire bonding, and
the connection section is a bonded section between the semiconductor element and a wire.

20. The semiconductor module according to claim 3, wherein
the semiconductor element and the control terminal are connected by wire bonding, and
the connection section is a bonded section between the semiconductor element and a wire.

* * * * *